(12) United States Patent
Tan et al.

(10) Patent No.: US 10,714,163 B2
(45) Date of Patent: Jul. 14, 2020

(54) METHODS FOR MITIGATING TRANSISTOR AGING TO IMPROVE TIMING MARGINS FOR MEMORY INTERFACE SIGNALS

(71) Applicant: Intel Corporation, Santa Clara, CA (US)

(72) Inventors: Tat Hin Tan, Malaysia (MY); Chee Hak Teh, Malaysia (MY); Tick Sern Loh, Santa Clara, CA (US); Wilfred Wee Kee King, Malaysia (MY); Yu Ying Ong, Santa Clara, CA (US)

(73) Assignee: Intel Corporation, San Jose, CA (US)

( * ) Notice: Subject to any disclaimer, the term of this patent is extended or adjusted under 35 U.S.C. 154(b) by 0 days.

(21) Appl. No.: 16/410,956

(22) Filed: May 13, 2019

(65) Prior Publication Data

US 2019/0267062 A1 Aug. 29, 2019

(51) Int. Cl.
*G11C 8/18* (2006.01)
*H03K 17/041* (2006.01)

(52) U.S. Cl.
CPC ......... *G11C 8/18* (2013.01); *H03K 17/04106* (2013.01)

(58) Field of Classification Search
CPC ....... G11C 8/18; G11C 29/028; G11C 29/023; G11C 2029/0409; H03K 17/04106
See application file for complete search history.

(56) References Cited

U.S. PATENT DOCUMENTS

| 6,049,846 | A | 4/2000 | Farmwald et al. |
| 6,266,285 | B1 | 7/2001 | Farmwald et al. |
| 7,177,201 | B1 | 2/2007 | Takayanagi |
| 9,015,507 | B2 | 9/2015 | Zhang et al. |
| 9,720,484 | B2 | 8/2017 | Zhang et al. |
| 2002/0018513 | A1 | 2/2002 | Curry et al. |
| 2003/0198110 | A1 | 10/2003 | Hasegawa et al. |
| 2005/0223211 | A1* | 10/2005 | Sukegawa ............. G06F 9/4403 713/2 |
| 2012/0140014 | A1* | 6/2012 | Hosier ....................... B41J 2/45 347/236 |
| 2014/0185388 | A1 | 7/2014 | Vaysman et al. |

* cited by examiner

*Primary Examiner* — Ajay Ojha
(74) *Attorney, Agent, or Firm* — Treyz Law Group, P.C.; Jason Tsai

(57) ABSTRACT

An integrated circuit is operable to communicate with an external component. The integrated circuit may include driver circuits for outputting clock signals and associated control signals to the external component in accordance with a predetermined interface protocol. The clock signals may toggle more frequently than the associated control signals. To help mitigate potential transistor aging effects that could negatively impact timing margins for the control signals, the control signals may be periodically toggled even during idle periods as allowed by the predetermined interface protocol to help improve timing margins.

20 Claims, 9 Drawing Sheets

600

| | | C[7] | C[6] | C[5] | C[4] | C[3] | C[2] | C[1] | C[0] |
|---|---|---|---|---|---|---|---|---|---|
| Write | Rising | BA3 | BA2 | BA1 | BA0 | L | L | L | H |
| | Falling | CA6 | CA5 | CA4 | CA3 | CA2 | PAR | CA1 | CA0 |
| CNOP | Rising | V | V | V | V | V | H | H | H |
| | Falling | V | V | V | V | V | PAR | V | V |

602 = Write rows; 604 = CNOP rows

| | | R[5] | R[4] | R[3] | R[2] | R[1] | R[0] |
|---|---|---|---|---|---|---|---|
| Activate | Rising | BA2 | BA1 | BA0 | RA14 | H | L |
| | Falling | BA3 | RA13 | RA15 | PAR | RA12 | RA11 |
| RNOP | Rising | RA10 | RA9 | RA8 | RA7 | RA6 | RA5 |
| | Falling | RA4 | RA3 | RA2 | PAR | RA1 | RA0 |
| | Rising | V | V | V | H | H | H |
| | Falling | V | V | V | PAR | V | V |

612 = Activate rows; 614 = RNOP rows

FIG. 6B

METHODS FOR MITIGATING TRANSISTOR AGING TO IMPROVE TIMING MARGINS FOR MEMORY INTERFACE SIGNALS

BACKGROUND

This relates generally to integrated circuits and more particularly, to integrated circuit packages with more than one integrated circuit die.

As demands on integrated circuit technology continue to outstrip even the gains afforded by ever decreasing device dimensions, an increasing number of applications demand a packaged solution with more integration than is possible in one silicon die. In an effort to meet this need, more than one IC die may be placed within an integrated circuit package (i.e., a multichip package). As different types of devices cater to different types of applications, more IC dies may be required in some systems to meet the requirements of high performance applications. Accordingly, to obtain better performance and higher density, a multichip package may include multiple dies arranged laterally along the same plane or may include multiple dies stacked on top of one another.

In such multichip package solutions, a multichip package will typically include a main logic die, transceiver dies, and high bandwidth memory (HBM) dies all mounted on a common interposer substrate within the multichip package. In such scenarios, the main logic die has to include transceiver input/output (IC) components for interfacing with the transceiver dies and HBM input/output components for interfacing with the high bandwidth memory dies.

The HBM interface uses a differential clock signal to latch row and column command/address signals while using a data strobe signal to latch the write data signals for the HBM memory dies. The write data strobe signals that accompany the transmitted write data signals generally do not have vastly different toggling behavior compared to the write data signals. In contrast, the differential clock signal toggles almost indefinitely while the row and column command/address signals toggle much less frequently in comparison to the clock signal.

The high activity factor of the clock signal degrades the n-channel metal-oxide-semiconductor (NMOS) transistors in the clock driver due to the hot carrier injection (HCI) phenomenon. On the other hand, the low activity factor of the command/address signals with the p-channel metal-oxide-semiconductor (PMOS) transistors in the command/address signal drivers driving those signals high will cause the PMOS transistors in the drivers to degrade due to the negative bias temperature instability (NBTI) phenomenon. When the clock signal is driven by weakened NMOS transistors and when the row and column command/address signals are driven by weakened PMOS transistors, the resulting timing margin is substantially reduced.

It is within this context that the embodiments described herein arise.

BRIEF DESCRIPTION OF THE DRAWINGS

FIG. 6A is a truth table showing illustrative requirements for column control signals specified by a predetermined memory interface protocol in accordance with an embodiment.

FIG. 6B is a truth table showing illustrative requirements for row control signals specified by a predetermined memory interface protocol in accordance with an embodiment.

DETAILED DESCRIPTION

The present embodiments relate to an inter-die interface and, more particularly, to methods and operating schemes for averting or reducing the aging degradation mismatch between driving transistors for driving clock signals on the interface and driving transistors for driving row and column control signals (e.g., command and address signals for both row and column control) that are latched using the clock signals. The clock signals may continue to toggle indefinitely except during self-refresh and power-down modes. After some time, the driving transistors outputting the clock signals will age, which will result in the clock signals incurring an additional delay $\Delta T_{CK}$ compared to when they are driven by fresh (un-aged) transistors.

Signals conveyed across the inter-die interface will need to behave in accordance with a predetermined interface protocol. The predetermined interface protocol may allow the row and column control signals to toggle even when the row and column control signals are idle (e.g., during a "no operation" or NOP). The present embodiments take advantage of this property of the interface protocol by periodically or sporadically toggling the row and column control signals even during NOPs so that the driver transistors outputting the row and column control signals will age at a faster rate than if they remained in the idle condition. This will result in the row and column control signals to incur an additional delay $\Delta T_{CA}$. Although the row and column control signals might not be toggled at the same frequency as the clock signals, the row and column control signals should be toggled sufficiently so that ($\Delta T_{CK}$-$\Delta T_{CA}$) is within the available interface timing margin.

Driving the inter-die interface signals in this way helps the transistors driving the row and column control signals to age at a comparable rate to the transistors driving the clock signals and therefore provides a tangible improvement to computer technology by gaining back the timing margin for the interface to mitigate transistor aging effects without resorting to interface recalibration. Conventional interface calibration will cause interface downtime, which might be unacceptable for datacenters, military/industrial applications, and other applications that require zero downtime.

It will be recognized by one skilled in the art, that the present exemplary embodiments may be practiced without some or all of these specific details. In other instances, well-known operations have not been described in detail in order not to unnecessarily obscure the present embodiments.

Figure 1:
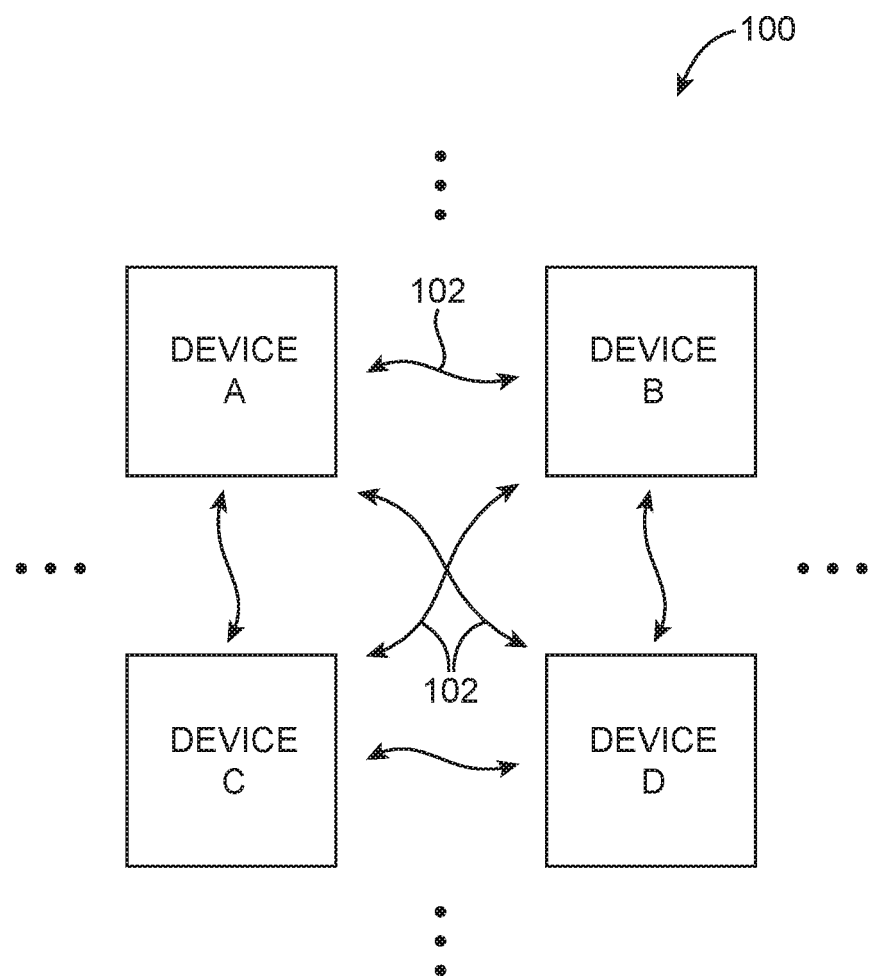
FIG. 1 is a diagram of an illustrative system of integrated circuit devices operable to communicate with one another in accordance with an embodiment.

FIG. 1 is a diagram of an illustrative system 100 of interconnected electronic devices. The system of interconnected electronic devices may have multiple electronic devices such as device A, device B, device C, device D, and interconnection resources 102. Interconnection resources 102 such as conductive lines and busses, optical interconnect infrastructure, or wired and wireless networks with optional intermediate switching circuitry may be used to send signals from one electronic device to another electronic device or to broadcast information from one electronic device to multiple other electronic devices. For example, a transmitter in device B may transmit data signals to a receiver in device C. Similarly, device C may use a transmitter to transmit data to a receiver in device B.

The electronic devices may be any suitable type of electronic device that communicates with other electronic devices. Examples of such electronic devices include integrated circuits having electronic components and circuits such as analog circuits, digital circuits, mixed-signal circuits, circuits formed within a single package, circuits housed within different packages, circuits that are interconnected on a printed-circuit board (PCB), circuits mounted on different circuit boards, etc.

Figure 2:
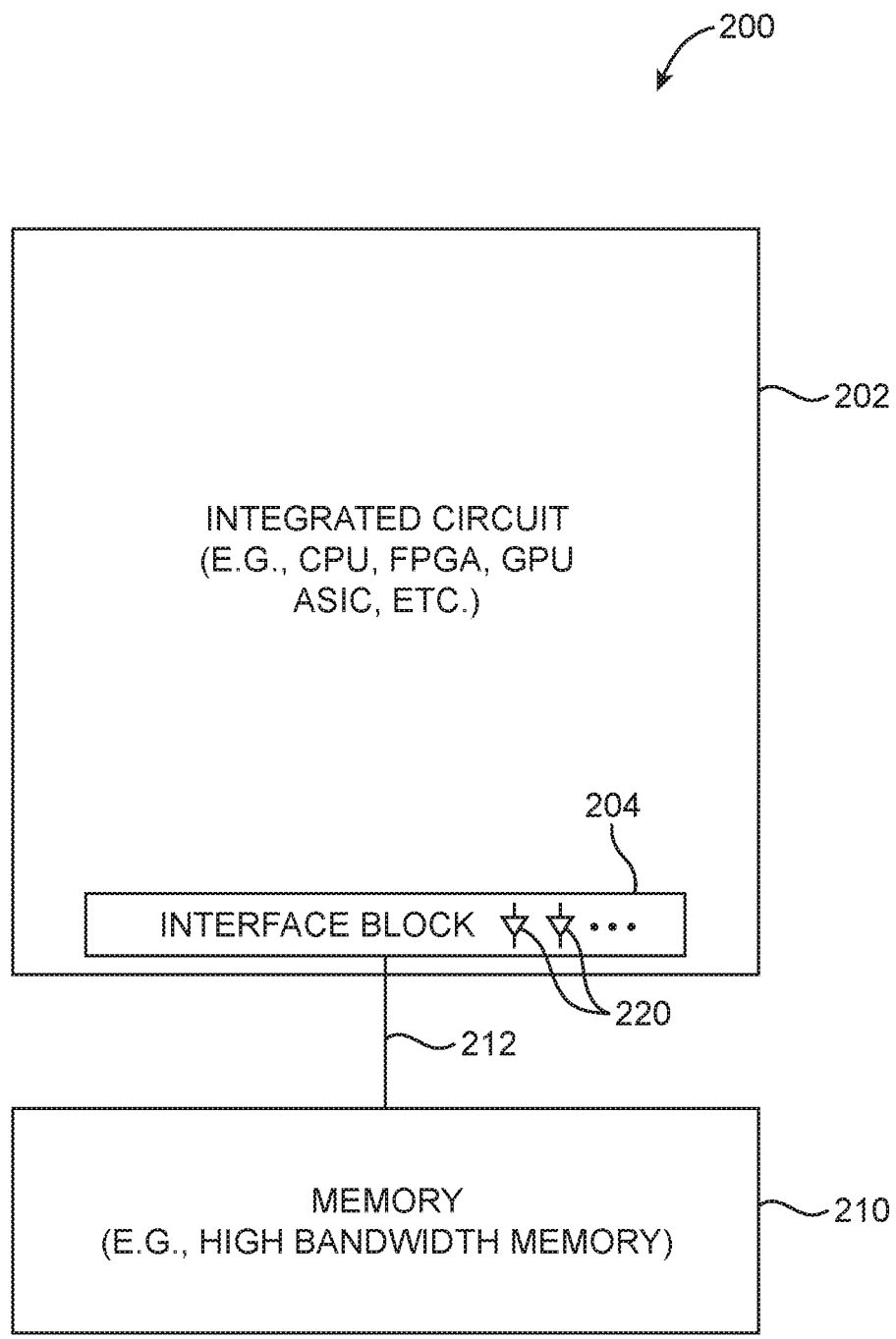
FIG. 2 is a diagram of an illustrative integrated circuit die operable to communicate with external memory via a memory interface in accordance with an embodiment.

FIG. 2 is a diagram of an illustrative system 200. As shown in FIG. 2, system 200 may include one or more integrated circuit dies such as an integrated circuit (IC) die 202 and memory 210. In one suitable arrangement, IC die 202 and memory 210 may be mounted on a common package substrate (e.g., a passive silicon substrate, an active silicon substrate, or other interposer carrier substrate) within a multichip package. This arrangement in which multiple dies are mounted on a common package substrate may sometimes be referred to as a "2.5D" arrangement. If desired, memory 210 might also be stacked directly on top of or directly below die 202, an arrangement sometimes referred to as "3D" stacking. Integrated circuit die 202 that provides the main processing power for the multichip package may be referred to as the "main" die, whereas electronic components other than main die 202 such as memory component 210 may be referred to as a "daughter" or auxiliary die.

Main IC die 202 may, for example, be a central processing unit (CPU), a programmable integrated circuit, a graphics processing unit (GPU), an application-specific integrated circuit (ASIC), an application specific standard product (ASSP), a microcontroller, a microprocessor, etc. Examples of programmable integrated circuits include programmable logic devices (PLDs), field programmable gate arrays (FPGAs), programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), and complex programmable logic devices (CPLDs), just to name a few.

Main die 202 may include an input-output (I/O) block such as interface block 204 configured to communicate with memory 210 via communications path 212. In one suitable arrangement, interface block 204 may be configured to support wide parallel interfaces such as external memory interfaces (EMIF) or more generic interfaces like GPIO (general purpose input-output) or LVDS (low-voltage differential signaling) interfaces. External memory interfaces that are supported by block 204 may include double data rate (DDR) interfaces such as DDR type-3 (DDR3), low power DDR3 (LPDDR3), DDR type-4 (DDR4), low power DDR4 (LPDDR4), DDR type-5 (DDR5), graphics DDRx, quad data rate (QDR), Open NAND Flash Interface (ONFI), or other suitable interfaces for communicating with external memory that is external to package 300. In such examples, interface block 204 may include memory controllers for supporting a wide variety of external memory protocols.

In another suitable arrangement, interface block 204 may be a universal interface block (UIB) for communicating with memory 210 that is formed in the same package as die 202. Connection 212 is therefore sometimes referred to as a universal interface bus. As examples, in-package memory components 210 may be implemented using random-access memory such as static random-access memory (SRAM), dynamic random-access memory (DRAM), low latency DRAM (LLDRAM), reduced latency DRAM (RLDRAM), or other types of volatile memory. If desired memory dies 306 may also be implemented using nonvolatile memory (e.g., fuse-based memory, antifuse-based memory, electrically-programmable read-only memory, etc.). Configured in this way, block 204 may serve as a physical-layer bridging interface between an associated memory controller (e.g., a non-reconfigurable "hard" memory controller or a reconfigurable "soft" memory controller logic) on the main die 202 and one or more high-bandwidth channels that is coupled to an associated memory die 210. In general, universal interface block 210 may be capable of supporting a wide variety of communications protocols, which are not limited to memory interface protocols, for interfacing with different types of daughter dies.

In accordance with an embodiment, interface block 204 can be used to support multiple parallel channel interfaces such as the JEDEC JESD235 High Bandwidth Memory (HBM) DRAM interface or the Quad Data Rate (QDR) wide IC SRAM interface (as examples). In such embodiments, memory 210 may be one or more high bandwidth memory (HBM) components stacked vertically or horizontally with respect to one another in the same multichip package. In contrast to EMIF interfaces having at most three to four DDR channels, a universal interface block 210 is able to support more than four memory channels, four to eight memory channels, eight to 16 memory channels, or more than 16 memory channels to support high bandwidth communications. Each of the parallel channels can support single data rate (SDR) or double data rate (DDR) communications.

Device configurations in which integrated circuit die 202 communicates with high bandwidth memory 210 may sometimes be described herein as an example. This type of arrangement is, however, merely illustrative. If desired, the methods and techniques for mitigating transistor aging effects to improve timing can be applied or extended to other type of memory or communications interfaces.

Signals conveyed between main die 202 and memory 210 via path 212 may be transferred in accordance with a predetermined interface protocol. For example, if memory 210 represents high bandwidth memory, signals being conveyed to high bandwidth memory 210 will have to comply with JEDEC's HBM interface protocol, which may include the first generation HBM interface definition, the second generation HBM2 interface definition, or newer generations of interface standards as they arise.

Figure 3:
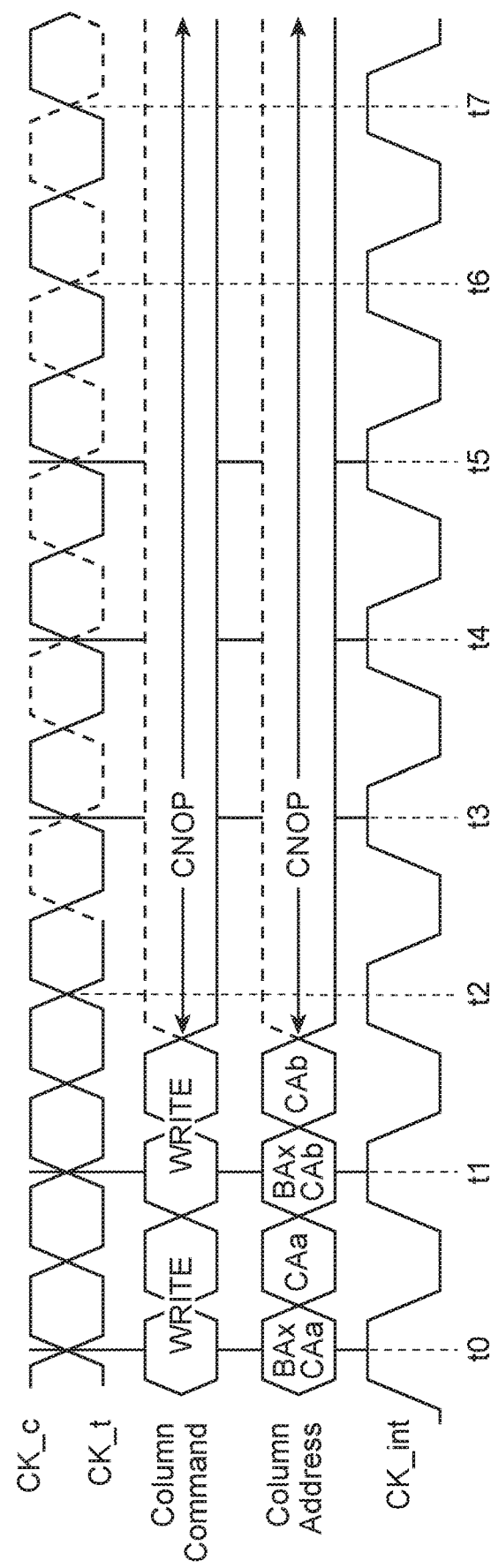
FIG. 3 is a timing diagram illustrating the toggling activity of an interface clock signal relative to associated command and address signals in accordance with an embodiment.

Still referring to FIG. 2, interface block 204 may include driver circuits such as drivers 220 for outputting data and control signals to memory 210. In accordance with a predetermined input-output interface definition such as the HBM interface protocol, signals driven over interface path 212 may include at least a memory interface clock signal and associated memory control signals. FIG. 3 is a timing diagram illustrating a differential memory interface clock signal and associated memory column control signals (e.g., column command signals and column address signals). As shown in FIG. 3, the differential memory interface clock signal may include a true clock signal CK_t and a complement clock signal CK_c, where CK_c is 180° out-of-phase with respect to CK_t.

In the example of FIG. 3, a column write command may be issued during the first two clock cycles from time t0-t2 while corresponding column address signals are issued within the same time period. Signals "BAx" may represent the desired memory bank address, whereas signals "CAa/CAb" may represent the desired column address within the selected bank. After time t2, both the column command and column address signals are idle, which is represented by the column no-operation or "CNOP" notation. Operated in this way (and since the interface clock signals are shifted by a 90° phase relative to the column signals), the clock signals CK_t/CK_c can be used to latch the column command and column address signals (sometimes referred to collectively as "column control signals"). The interface clock signals may also be used to clock other signals for the memory interface and thus are toggling almost indefinitely, whereas the column signals are toggle much less frequently. Note that the column control signals may toggle in accordance with an internal clock signal CK_int, which is also 90° phase offset relative to the interface clock signals.

Figure 4:
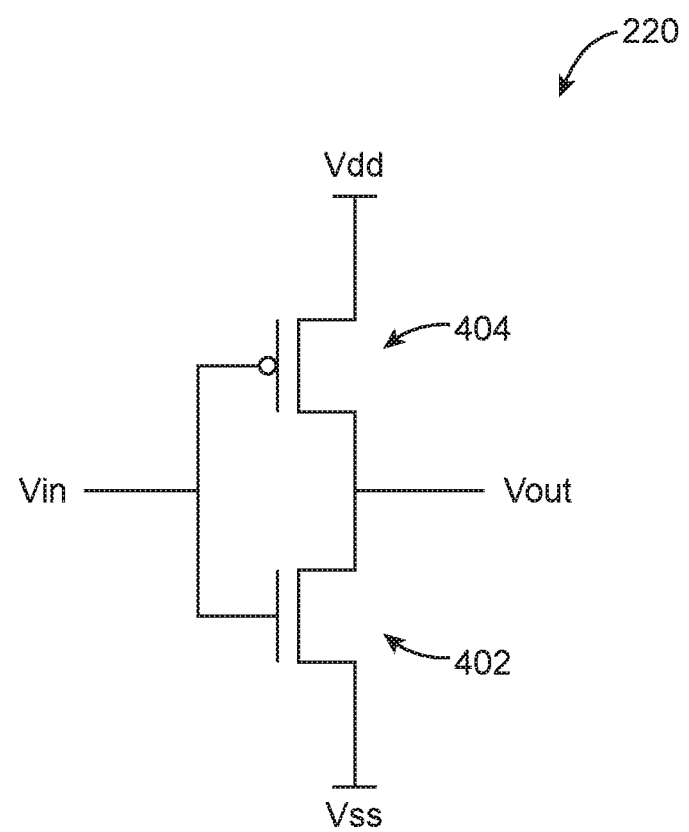
FIG. 4 is a circuit diagram of an illustrative driver circuit in accordance with an embodiment.

FIG. 4 is a circuit diagram of an illustrative driver circuit 220 that may be included with interface block 204 for driving the clock signals and/or the column control signals. As shown in FIG. 4, driver 220 may include at least a n-channel pull-down transistor 402 and a p-channel pull-up transistor 404 coupled in series between a first power supply terminal on which positive power supply voltage Vdd is provided and a second power supply terminal on which ground (or negative) power supply voltage Vss is provided. Transistors 402 and 404 may have gate terminals that are shorted to one another, which serve as the input terminal of driver 220 (where input voltage Vin is provided). The node at which transistor 402 is series-connected to transistor 404 may serve as the output terminal of driver 220 (where output voltage Vout is provided). FIG. 4 illustrates a simplified implementation of driver 220. In general, driver circuit 220 may include additional transistors and/or other components to help improve its output capability.

Referring back to FIG. 3, the relative high toggling/activity factor and constant switching behavior of the clock signals CK_c/t degrade, due to the hot carrier injection (HCI) phenomenon, the current driving ability of the n-channel transistors 402 within drivers 220 that are used to generate those clock signals. As a result, the re-channel transistors that drive the falling edge of clock signals CK_c/t tend to degrade much more than the n-channel transistors driving the column control signals (since the column control signals toggle much less often). While the impact of this transistor degradation might not immediately result in a sudden catastrophic event, the detrimental effect will begin to manifest itself as a gradual channel timing loss, which can be categorized as a long-term aging degradation.

Meanwhile, the relative low toggling/activity factor and long idle times of the column control signals during CNOP (e.g., during which the p-channel transistors 404 within drivers 220 that are used to generate the column control signals are constantly driving a logic "1" for long periods of time) will also cause, due to the negative bias temperature instability (NBTI) phenomenon, the current driving ability of those p-channel transistors 404 to degrade. In contrast, the p-channel transistors 404 driving the clock signals CK_t/c are much less susceptible to NBTI effects since they are toggling most of the time.

Figure 5A:
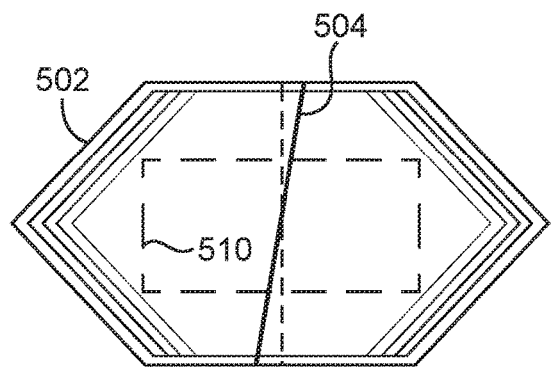
FIG. 5A is an eye diagram for a rising edge of the interface clock signal prior to aging.

The effects of the weakened n-channel transistors that drive clock signals CK_t/c and the effects of the weakened p-channel transistors that drive the column control signals are shown in FIGS. 5A-5D. FIG. 5A shows an eye diagram for a rising edge of interface clock signal CK_t prior to aging. As shown in FIG. 5A, the rising clock edge 504 of signal CK_t may be perfectly centered within eye opening 502 created by the column control signals. The timing margin may be represented by the width and height of the eye opening, as indicated by dotted box 510.

Figure 5B:
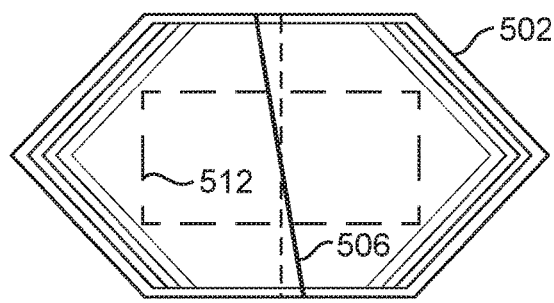
FIG. 5B is an eye diagram for a falling edge of the interface clock signal prior to aging.

Similarly, FIG. 5B shows an eye diagram for a falling edge of interface clock signal CK_t prior to aging. As shown in FIG. 5B, the falling clock edge 506 of signal CK_t may be perfectly centered within eye opening 502 created by the column control signals. The timing margin may be represented by the width and height of the eye opening, as indicated by dotted box 512.

Figure 5C:
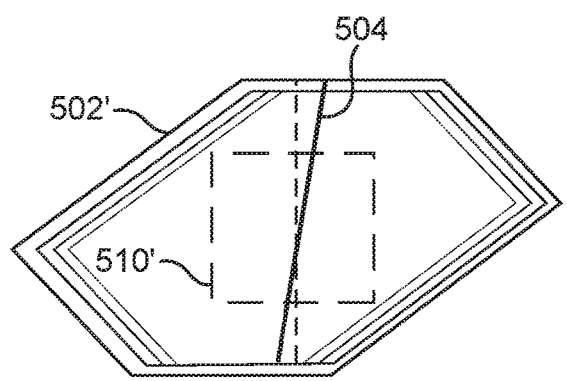
FIG. 5C is an eye diagram for a rising edge of the interface clock signal that has been degraded due to transistor aging effects.

FIG. 5C shows the eye diagram for the rising edge of interface clock signal CK_t that has been degraded due to transistor aging effects. As described previously in connection with FIGS. 3 and 4, the p-channel driver transistors that drive the column control signals may be severely weakened by the NBTI aging. This results in the skewed eye opening 502' in which the rising clock edges are much slower than the falling clock edges. As shown in FIG. 5C, the eye width and eye height illustrated by dotted box 510' are substantially smaller than those of box 510 in FIG. 5A, which results in a much smaller timing margin even if rising edge 504 were perfectly centered within box 510'.

Figure 5D:
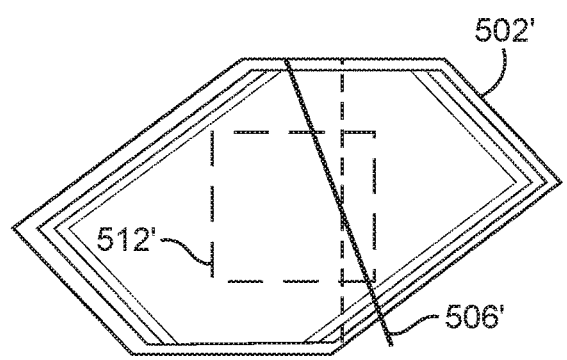
FIG. 5D is an eye diagram for a falling edge of the interface clock signal that has been degraded due to transistor aging effects.

FIG. 5D shows the eye diagram for the falling edge of interface clock signal CK_t that has been degraded due to transistor aging effects. As described previously in connection with FIGS. 3 and 4, not only are the p-channel driver transistors that drive the column control signals severely weakened by the NBTI aging, but the n-channel driver transistors that drive the falling edge of the clock signal are also weakened by the HCI aging. This results in the skewed eye opening 512' having a much slower falling clock edge 506'. As shown in FIG. 5D, the eye width and eye height illustrated by dotted box 512' are substantially smaller than those of box 512 in FIG. 5B. Moreover, the degraded speed of the falling clock edge 506' severely reduces the hold timing margin within box 512' (as shown by the diminished margin between the right edge of box 512' and the where falling clock edge 506' is centered within box 512').

The discussion above describing the problems associated with transistor aging and timing margin degradation with respect to the column control signals are merely illustrative. In general, the same technical issues also apply to row control signals (e.g., row command signals and row address signals may also degrade at different rates relatively to the interface clock signals). The row command signals and the row address signals are sometimes referred to collectively as "row control signals." The column control signals and the row control signals are sometimes referred to collectively as "memory control signals."

Conventional methods for dealing with such types of transistor-aging-related timing margin degradation involve HBM interface channel recalibration or data scrambling. HBM interface channel recalibration can help resolve the channel timing loss due to aging by searching for the optimal CK_t/c placement after some use time (e.g., after 6 months). Recalibration, however, would require a complete reboot of the HBM interface, which is unacceptable for applications that demand zero downtime. Such applications are often found in datacenters or military/industrial infrastructure applications. In certain cases, it might also be impossible to find an optimal point when there is a strong mismatch between the pull-up transistors and pull-down transistors in the output driver.

Another technique for dealing with transistor-aging-related timing margin degradation is data scrambling on write data signals. Data scrambling on the write data signal will ensure a sufficient amount of random data transitions and toggling, which will help the transistors that drive the write data signal to degrade at almost the same rate as the transistors that drive the write data strobe signal.

This technique, while effective for write data/data strobe signals, does not apply to row and column command/address signals. If the p-channel transistors are driving high for long periods of time (i.e., either during power-down mode or self-refresh mode), sacrificial pull-up transistors can be implemented to pull the signal high while disabling the main p-channel pull-up transistors during functional mode. The sacrificial transistors would be subject to NBTI aging while the main pull-up transistors would be protected from any aging effect. The use of sacrificial pull-up transistors, however, may only be limited to solving this problem in the power-down and self-refresh modes.

As described in connection with FIG. 3, there may be long periods of time where the column and row control signals are idle. For the column command/address signals to be idle, a column no operation or "CNOP" command may be issued. For the row command/address signals to be idle, a row no operation or "RNOP" command may be issued. FIG. 6A shows an exemplary truth table 600 showing how the HBM2 interface protocol defines certain column commands. Rows 602 specify the column bit requirements to issue a write command, whereas rows 604 specify the column bit requirements to issue a CNOP command. The bit requirements are also different for the rising and falling clock edges.

For instance, to issue a write command, column control bits C[3:0] must be "0001" (since "L" in table 600 signifies a low bit requirement, whereas "H" signifies a high bit requirement) while C[7:4] are reserved for bank address signals BA[3:0] during the rising edge of the interface clock. During the falling edge of the interface clock, all column control bits C[*] except for C[2] are used to encode the column address signals CA[6:0]. Bit C[2] is reserved for parity values.

Now referring to rows 604 in table 600, to issue a CNOP, column control bits C[3:0] must be "111" (since "H" signifies a high bit requirement) while C[7:4] must be "valid" (V) during the rising edge of the interface clock. For a signal to be considered valid, it needs to be either at logic one or logic zero. During the falling edge of the interface clock, all column control bits C[*] except for C[2] have to be valid. Like before, bit C[2] is reserved for parity values.

FIG. 6B shows an exemplary truth table 610 showing how the HBM2 interface protocol defines certain row commands. Rows 612 specify the row bit requirements to issue an activate command, whereas rows 614 specify the row bit requirements to issue a RNOP command. The bit requirements are also different for the rising and falling clock edges.

For instance, to perform an activate operation, two clock cycles are needed. During the rising edge of the first clock cycle, row control bits R[1:0] must be "10" (since "L" in table 610 signifies a low bit requirement, whereas "H" signifies a high bit requirement) while R[5:2] are reserved for bank address signals BA[2:0] and row address bit RA14. During the falling edge of the first clock cycle, row control bit R[5] is reserved for bank address bit BA3, whereas row control bits R[4:3,1:0] are reserved for row address signals RA[13,15,12,11]. Bit R[2] may be reserved for parity values. During the rising edge of the second clock cycle, all row control bits R[*] may be reserved for row address signals RA[10:5]. During the falling edge of the second clock cycle, all row control bits R[*] except for R[2] are reserved for row address signals RA[4:0]. Like before, bit R[2] is reserved for parity values at the falling clock edge.

Now referring to rows 614 in table 610, to issue a RNOP, row control bits R[2:0] must be "111" (since "H" signifies a high bit requirement) while R[5:3] must be "valid" (V) during the rising edge of the interface clock. For a signal to be considered valid, it needs to be either at logic one or logic zero. During the falling edge of the interface clock, all row control bits R[*] except for R[2] have to be valid. Like before, bit R[2] is reserved for parity values at the falling clock edge.

Figure 7:
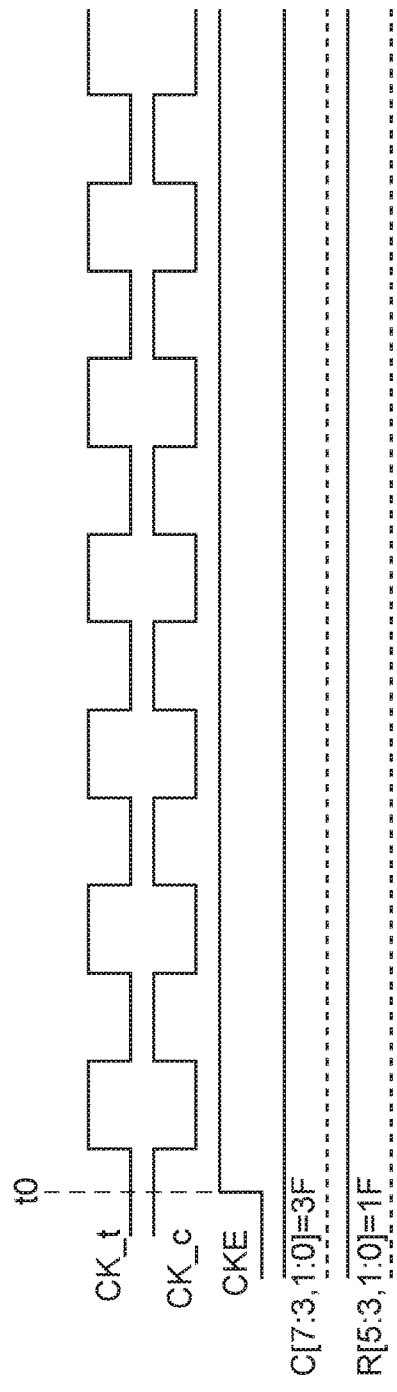
FIG. 7 is a timing diagram illustrating a scenario in which the column and row control signals are constantly held high.

FIG. 7 is a timing diagram illustrating a standard approach in which the column and row control signals are constantly held high. Holding the control signals high for a long time will help to reduce power consumption. As shown in FIG. 7, interface clock signals CK_t and CK_c may begin to toggle after a clock enable signal CKE has been asserted at time t0. Following time t0, CNOP and RNOP may both be issued indefinitely until a write command or an activate command is needed (as examples).

To issue a CNOP, column control bits C[7:3,1:0] (with the exception of parity bit C[2]) may be set to "1111111" (i.e., may all be maintained at logic "1"), which complies with the CNOP protocol for both the rising and falling edges shown in FIG. 6A (since "1" is a valid signal). Similarly, to issue a RNOP, the row control bits R[5:3,1:0] (with the exception of parity bit R[2]) may be set to "11111" (i.e., may all be maintained at logic "1"), which complies with the RNOP protocol for both the rising and falling edges shown in FIG. 6B (since "1" is a valid signal). Operating the row and column control signals in this way (i.e., maintaining C[*] and R[*] high for long periods of time) will cause the p-channel driver transistors driving these signals to be disproportionately weakened, which substantially degrades timing margins.

Figure 8:
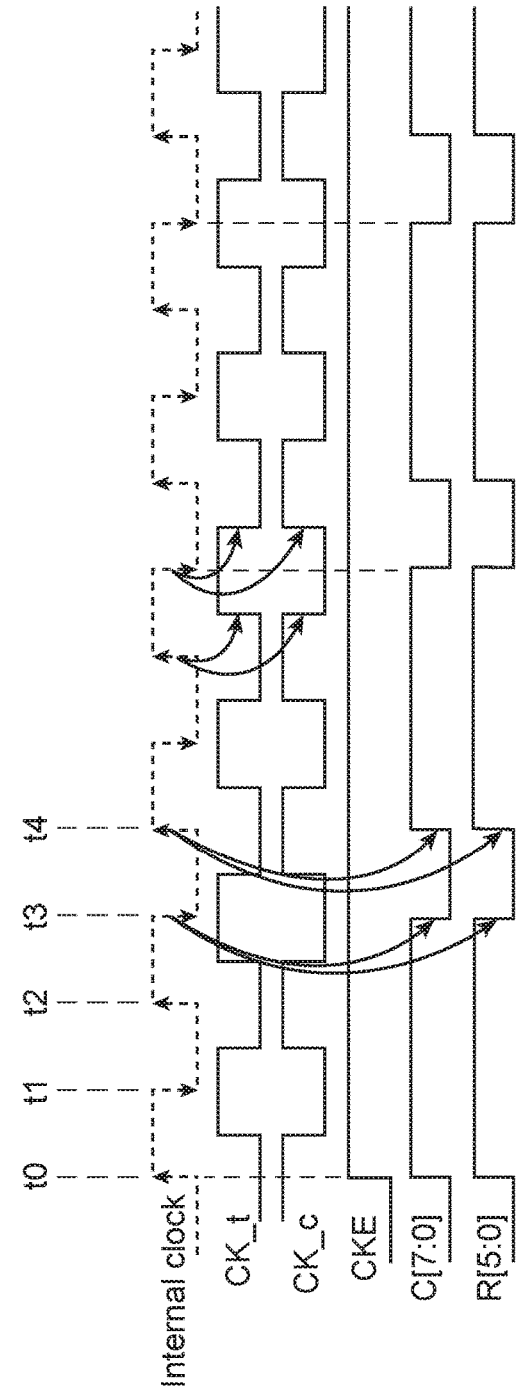
FIG. 8 is a timing diagram illustrating an improved operating scheme in which the column and row control signals are periodically driven low to help match the transistor aging effects between the interface clock signal and the column and row control signals in accordance with an embodiment.

FIG. 8 is a timing diagram illustrating an improved operating scheme in which the column and row control signals are periodically driven low to help match the transistor aging effects between the interface clock signal and the column and row control signals in accordance with an embodiment. As shown in FIG. 8, interface clock signals CK_t and CK_c may begin to toggle after a clock enable signal CKE has been asserted at time t0. Following time t0, CNOP and RNOP may both be issued indefinitely until a write command or an activate command is needed (as examples).

To issue a CNOP, C[7:0] may all be driven high (at time t1) to comply with the CNOP requirements at the rising clock edge (see the penultimate row in table 600). Note that C[2] may also be driven high if an even parity scheme is implemented. At the first falling clock edge (at time t2), column control bits C[7:0] can be maintained at "11111111" while still complying with the CNOP definition at the falling clock edge (see bottom row of table 600).

At the second rising edge (at time t2), nothing needs to be changed. However, at the second falling edge (at time t3), column control bits C[7:0] may all be driven low (e.g., to "00000000") while still being able to comply with the CNOP requirements at the falling clock edge. As shown in the bottom row of table 600, bits C[7:3,1:0] just need to be valid (and "0" is considered to be valid) while C[2] should also be "0" for even parity. At the following rising clock edge (at time t4), control bits C[7:0] may be reasserted to all high values.

Still referring to FIG. 8, to issue a RNOP, R[5:0] may all be driven high (at time t1) to comply with the RNOP requirements at the rising clock edge (see the penultimate row in table 610). Note that R[2] may also be driven high if an even parity scheme is implemented. At the first falling clock edge (at time t2), row control bits R[5:0] can be maintained at "111111" while still complying with the RNOP definition at the falling clock edge (see bottom row of table 610).

At the second rising edge (at time t2), nothing needs to be changed. However, at the second falling edge (at time t3), row control bits R[5:0] may all be driven low (e.g., to "000000") while still being able to comply with the RNOP requirements at the falling clock edge. As shown in the bottom row of table 610, bits R[5:3,1:0] just need to be valid (and "0" is considered to be valid) while R[2] should also be "0" for even parity. At the following rising clock edge (at time t4), control bits R[7:0] may be reasserted to all high values.

By toggling the column control signals C[*] and the row control signals R[*] in this way, the aging of the p-channel transistors driving these signals will be substantially lessened while also allowing those transistors to age at a rate that is more comparable to the transistors driving the interface clock signals CK_t/c. In other words, the present embodiments exploit this degree of freedom offered by the interface protocol for the values associated with the falling clock edge.

The example of FIG. 8 illustrates periodically pulsing the column and row command/address signals once every two clock cycles (e.g., N=2). This is, however, merely illustrative. If desired, the column and/or row command/address bits may be periodically or sporadically pulsed once every three clock cycles (N=3), once every four clock cycles (N=4), once every five clock cycles (N=5), or at any other suitable interval. If desired, column bits C[*] and row bits R[*] might even be pulsed every clock cycle at the expense of high power consumption. In general, the memory control bits should be toggled sufficiently to help balance the aging of the transistors driving the memory control bits without violating power consumption requirements.

In summary, all the row and column control values associated with the rising edge of the interface clock should be driven high. For all the row and column control values associated with the falling edge of the interface clock, the output driver can selectively drive logic zeros on every N-th falling clock edge or logic ones on every other falling clock edge, where N is defined by a user of the system.

Figure 9:
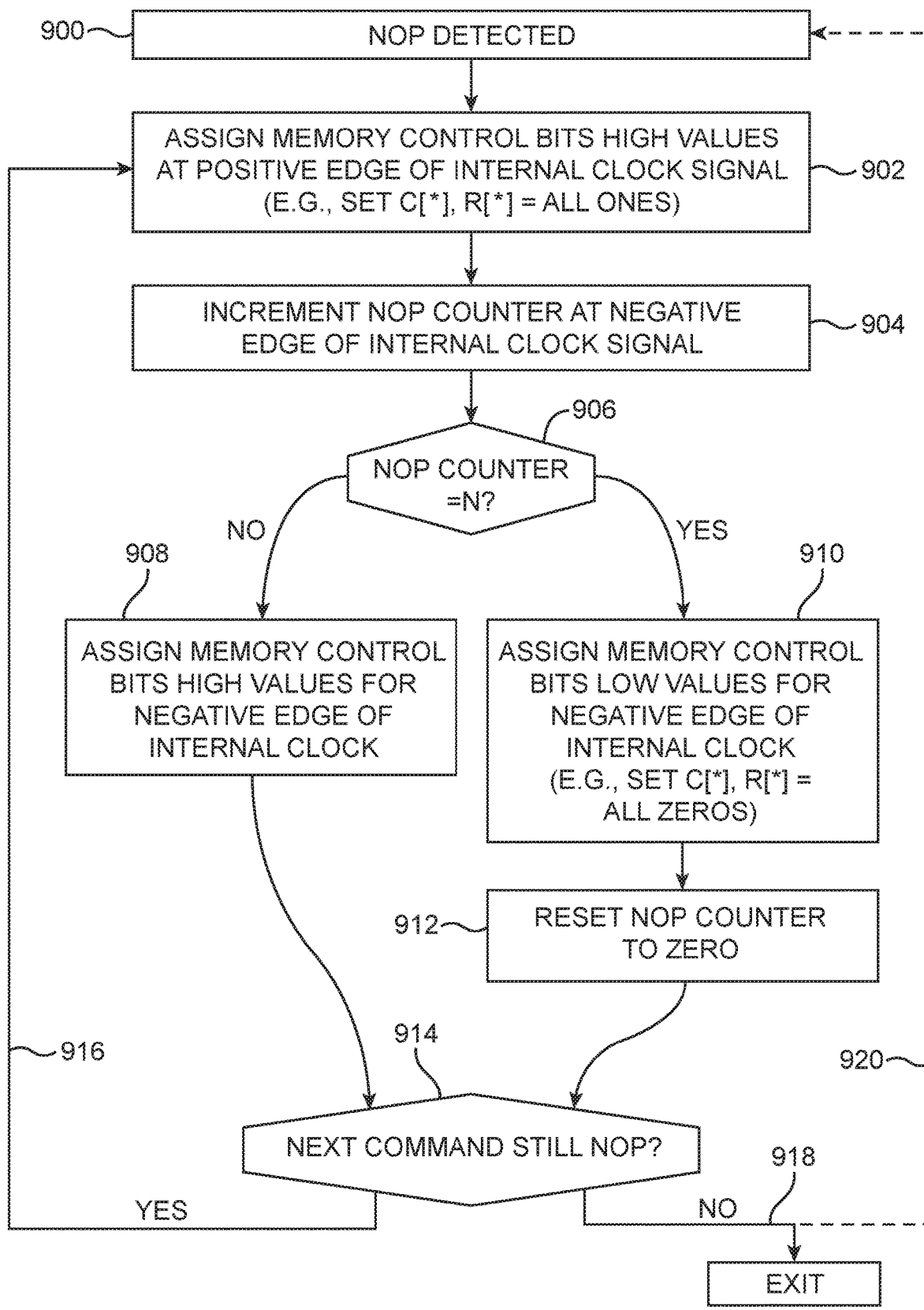
FIG. 9 is a flow chart of illustrative steps for controlling the column and row command/address signals during a "no operation" (NOP) in accordance with an embodiment.

FIG. 9 is a flow chart of illustrative steps for controlling the column and row command/address signals during a column or row NOP in accordance with an embodiment. At step 900, the interface block (see, e.g., input-output block 204 of FIG. 2) may detect that it needs to issue a NOP to the external memory 210.

At step 902, the interface block may assign the memory control bits high values at the positive clock edge of internal clock signal CK_int (e.g., so that column command/address bits C[*] and row command/address bits R[*] may be all logic ones at the falling edge of the interface clock signal CK_t).

At step 904, the interface block may increment a NOP counter in response to detecting a negative edge of the internal clock signal. If desired, there may be separate NOP counters for the row and column control signals. At step 906, the interface block may check whether the NOP counter output is equal to the user-defined N.

In response to determining that the NOP counter output is not yet equal to N, processing may proceed to step 908, and the interface block may direct the driver transistors to continue to output high values at the negative edge of the internal clock CK_int (e.g., so that bits C[*] and R[*] will be all ones at the falling edge of the interface clock signal CK_t).

In response to determining that the NOP counter output is equal to N, processing may proceed to step 910, and the interface block may direct the driver transistor to output all low values at the negative edge of the internal clock CK_int (e.g., so that bits C[*] and R[*] will be all zeros at the falling edge of the interface clock signal CK_t). At step 912, the NOP counter output may be reset to zero.

Step 914 may follow after either step 908 or step 912. At step 914, the interface block may determine whether the next command is still a NOP. If so, processing may loop back to step 902 to perform another iteration, as indicated by return path 916. If not, the process may either exit (as indicated by path 918) or may continue to wait for the next NOP (as indicated by return path 920).

Although the methods of operations are described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The advantage of having a user-defined variable N is to allow the user to avoid over-toggling to keep power consumption in check while ensuring sufficient channel timing margin. For example, if the HBM2 channel is still able to meet timing criteria at 2.8 Gbps when N=4 instead of N=2, then it might be preferable to choose N=4 in order to reduce power consumption. If, however, a selection of N=4 would violate the timing margin requirements at 2.8 Gbps, then perhaps a lower N is needed without violating the power limits.

Figure 10A:
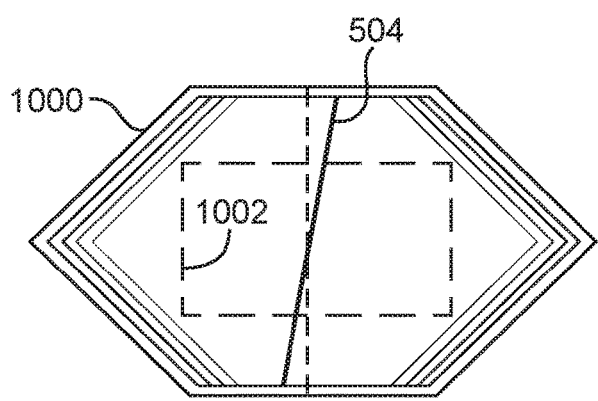
FIG. 10A is an eye diagram for a rising edge of the interface clock signal that shows improved timing margins even after transistor aging in accordance with an embodiment.

FIG. 10A shows the eye diagram 1000 for the rising edge of the interface clock signal that shows improved timing margins even after transistor aging in accordance with an embodiment. By periodically toggling the column and row control signals, the corresponding eye opening 1002 is much less skewed in comparison to that of FIGS. 5C and 5D. As shown in FIG. 10A, the eye width and eye height illustrated by dotted box 1002 are substantially larger than those of box 510' in FIG. 5C, which results in a much improved timing margin when rising edge 504 is perfectly centered within box 1002.

Figure 10B:
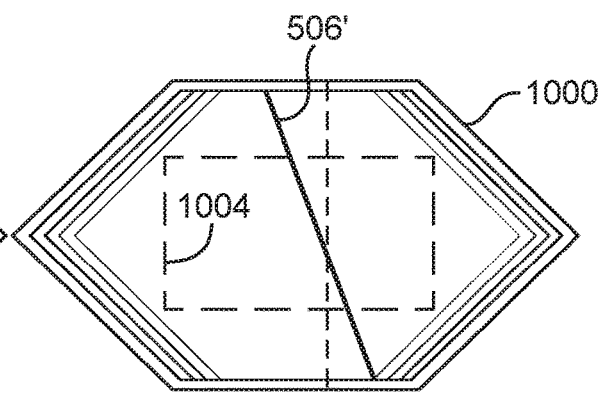
FIG. 10B is an eye diagram for a falling edge of the interface clock signal that shows improved timing margins even after transistor aging in accordance with an embodiment.

FIG. 10B shows the eye diagram 100 for the falling edge of the interface clock signal that shows improved timing margins even after transistor aging in accordance with an embodiment. As described previously in connection with FIGS. 3 and 4, the n-channel driver transistors that drive the falling edge of the clock signal are weakened by the HCI aging. However, since the eye opening 1004 is much improved by the periodic toggling of the column and row control signals, the resulting timing margin is still sufficient large even when the falling clock edge 506' has degraded.

The embodiments of FIGS. 2-10 in which the techniques for mitigating undesired aging effects is applied to an intra-package HBM interface is merely illustrative. In general, the methods and techniques for mitigating transistor aging effects to improve timing can be applied or extended to other type of memory or communications interfaces having associated protocols that allow for the exploitation of flexible signal values during idle periods.

EXAMPLES

The following examples pertain to further embodiments.

Example 1 is an integrated circuit die, comprising: an interface block operable to communicate with an external component in accordance with a predetermined interface protocol, wherein the interface block is configured to output an interface clock signal and to output a control signal that is latched at the external component using the interface clock signal, and wherein the interface block is further configured to periodically toggle the control signal during idle periods to improve timing margins by mitigating transistor aging effects in the interface block.

Example 2 is the integrated circuit die of example 1, wherein the external component optionally comprises memory, and wherein the control signal optionally includes command and address bits.

Example 3 is the integrated circuit die of example 2, wherein the integrated circuit die and the external component are optionally formed within a multichip package.

Example 4 is the integrated circuit die of any one of examples 1-3, wherein the interface block is optionally further configured to issue a no operation (NOP) during the idle periods.

Example 5 is the integrated circuit die of example 4, wherein the predetermined interface protocol optionally allows the control signal to be driven high during both the rising edge and the falling edge of the interface clock signal.

Example 6 is the integrated circuit die of example 5, wherein the predetermined interface protocol optionally also allows the control signal to be driven low during the falling edge of the interface clock without.

Example 7 is the integrated circuit die of example 6, wherein the interface block optionally comprises a no operation (NOP) counter configured to count the number of NOPs, and wherein the control signal is only toggled when the number of NOPs output by the NOP counter reaches a predetermined value.

Example 8 is the integrated circuit die of any one of examples 1-7, wherein the interface block optionally comprises: a first driver circuit configured to output the interface clock signal; and a second driver circuit configured to output the control signal, wherein periodically toggling the control signal during the idle periods enable transistors of the second driver circuit to age at a comparable rate to transistors of the first driver circuit.

Example 9 is a method of operating an integrated circuit, comprising: using an interface block within the integrated circuit to communicate with an external component in accordance with a predetermined interface protocol; with first driving transistors in the interface block, outputting an interface clock signal to the external component; with second driving transistors in the interface block, outputting a control signal to the external component; and with the interface block, reducing the difference between the rate at which the second driving transistors age and the rate at which the first driving transistors age by toggling the control signal during idle periods.

Example 10 is the method of example 9, wherein toggling the control signal during the idle periods optionally comprises detecting a no-operation (NOP).

Example 11 is the method of example 10, wherein toggling the control signal during the idle periods optionally further comprises driving the control signal high during a positive edge of the interface clock signal.

Example 12 is the method of example 11, optionally further comprising: incrementing a no-operation (NOP) count value in response to detecting a negative edge of the interface clock signal during the NOP.

Example 13 is the method of example 12, optionally further comprising: determining whether the NOP count value is equal to a predetermined count value.

Example 14 is the method of example 13, optionally further comprising: in response to determining that the NOP count value is not equal to the predetermined count value, continuing to drive the control signal high during the negative edge of the interface clock during the NOP.

Example 15 is the method of example 13, optionally further comprising: in response to determining that the NOP count value is equal to the predetermined count value, driving the control signal low during the negative edge of the interface clock during the NOP; and resetting the NOP count value to zero.

Example 16 is a system, comprising: an integrated circuit die; and a memory component operable to communicate with the integrated circuit die in accordance with a predetermined memory interface protocol, wherein the integrated circuit die is configured to output an interface clock signal to the memory component and to output memory control signals to the memory component, wherein the predetermined memory interface protocol allows the memory control signals to be driven high and allows the memory control signals to be driven low during a no-operation (NOP), and wherein the integrated circuit die exploits these allowances of the predetermined memory interface protocol to mitigate undesired transistor aging effects.

Example 17 is the system of example 16, wherein the control signals optionally comprise memory column command and address signals.

Example 18 is the system of example 17, wherein the control signals optionally further comprise memory row command and address signals.

Example 19 is the system of example 18, wherein the integrated circuit die is optionally configured to mitigate the undesired transistor aging effects by periodically pulsing the memory control signals during no-operations.

Example 20 is the system of example 19, wherein the frequency of the pulsing of the memory control signals is optionally decreased to reduce power consumption.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit die, comprising:
   an interface block operable to communicate with an external component in accordance with a predetermined interface protocol, wherein the interface block is configured to output an interface clock signal and to output a control signal that is latched at the external component using the interface clock signal, and wherein the interface block is further configured to periodically toggle the control signal during idle periods to improve timing margins by mitigating transistor aging effects in the interface block.

2. The integrated circuit die of claim 1, wherein the external component comprises memory, and wherein the control signal includes command and address bits.

3. The integrated circuit die of claim 2, wherein the integrated circuit die and the external component are formed within a multichip package.

4. The integrated circuit die of claim 1, wherein the interface block is further configured to issue a no operation (NOP) during the idle periods.

5. The integrated circuit die of claim 4, wherein the predetermined interface protocol allows the control signal to be driven high during both the rising edge and the falling edge of the interface clock signal.

6. The integrated circuit die of claim 5, wherein the predetermined interface protocol also allows the control signal to be driven low during the falling edge of the interface clock without.

7. The integrated circuit die of claim 6, wherein the interface block comprises a no operation (NOP) counter configured to count the number of NOPs, and wherein the control signal is only toggled when the number of NOPs output by the NOP counter reaches a predetermined value.

8. The integrated circuit die of claim 1, wherein the interface block comprises:
   a first driver circuit configured to output the interface clock signal; and
   a second driver circuit configured to output the control signal, wherein periodically toggling the control signal during the idle periods enable transistors of the second driver circuit to age at a comparable rate to transistors of the first driver circuit.

9. A method of operating an integrated circuit, comprising:
   using an interface block within the integrated circuit to communicate with an external component in accordance with a predetermined interface protocol;
   with first driving transistors in the interface block, outputting an interface clock signal to the external component;
   with second driving transistors in the interface block, outputting a control signal to the external component; and
   with the interface block, reducing the difference between the rate at which the second driving transistors age and the rate at which the first driving transistors age by toggling the control signal during idle periods.

10. The method of claim 9, wherein toggling the control signal during the idle periods comprises detecting a no-operation (NOP).

11. The method of claim 10, wherein toggling the control signal during the idle periods further comprises driving the control signal high during a positive edge of the interface clock signal.

12. The method of claim 11, further comprising:
    incrementing a no-operation (NOP) count value in response to detecting a negative edge of the interface clock signal during the NOP.

13. The method of claim 12, further comprising:
    determining whether the NOP count value is equal to a predetermined count value.

14. The method of claim 13, further comprising:
    in response to determining that the NOP count value is not equal to the predetermined count value, continuing to drive the control signal high during the negative edge of the interface clock during the NOP.

15. The method of claim 13, further comprising:
    in response to determining that the NOP count value is equal to the predetermined count value, driving the control signal low during the negative edge of the interface clock during the NOP; and
    resetting the NOP count value to zero.

16. A system, comprising:
    an integrated circuit die; and
    a memory component operable to communicate with the integrated circuit die in accordance with a predetermined memory interface protocol, wherein the integrated circuit die is configured to output an interface clock signal to the memory component and to output memory control signals to the memory component, wherein the predetermined memory interface protocol allows the memory control signals to be driven high and allows the memory control signals to be driven low during a no-operation (NOP), and wherein the integrated circuit die exploits these allowances of the predetermined memory interface protocol to mitigate undesired transistor aging effects.

17. The system of claim 16, wherein the control signals comprise memory column command and address signals.

18. The system of claim 17, wherein the control signals further comprise memory row command and address signals.

19. The system of claim 18, wherein the integrated circuit die is configured to mitigate the undesired transistor aging effects by periodically pulsing the memory control signals during no-operations.

20. The system of claim 19, wherein the frequency of the pulsing of the memory control signals is decreased to reduce power consumption.

* * * * *